US008067288B2

(12) United States Patent
Mallikararjunaswamy

(10) Patent No.: US 8,067,288 B2
(45) Date of Patent: Nov. 29, 2011

(54) CONFIGURATION AND METHOD OF MANUFACTURING THE ONE-TIME PROGRAMMABLE (OTP) MEMORY CELLS

(75) Inventor: Shekar Mallikararjunaswamy, San Jose, CA (US)

(73) Assignee: Alpha & Omega Semiconductor, Ltd (BM)

( * ) Notice: Subject to any disclaimer, the term of this patent is extended or adjusted under 35 U.S.C. 154(b) by 84 days.

(21) Appl. No.: 12/587,609

(22) Filed: Oct. 9, 2009

(65) Prior Publication Data
US 2010/0035397 A1 Feb. 11, 2010

Related U.S. Application Data

(62) Division of application No. 11/518,001, filed on Sep. 7, 2006, now Pat. No. 7,602,029.

(51) Int. Cl.
*H01L 29/72* (2006.01)

(52) U.S. Cl. ........ 438/289; 438/131; 438/132; 438/199; 438/275; 438/279; 365/145; 365/225.7

(58) Field of Classification Search .................. 438/131, 438/132, 199, 275, 279, 289; 365/145, 225.7
See application file for complete search history.

(56) References Cited

U.S. PATENT DOCUMENTS

2006/0121666 A1* 6/2006 Grutzediek et al. .......... 438/199
* cited by examiner

*Primary Examiner* — Edward Wojciechowicz
(74) *Attorney, Agent, or Firm* — Bo-In Lin

(57) ABSTRACT

This invention discloses a method for manufacturing a one-time programmable (OTP) memory includes a first and second MOS transistors connected in parallel and controlled by a common gate formed with a single polysilicon stripe. The method further comprises a step of implanting a drift region in a substrate region below a drain and source of the first and second MOS transistors counter doping a lightly dope drain (LDD) encompassing and surrounding a drain and a source of the first MOS transistor having a different threshold voltage than the second MOS transistor not reached by the drift region.

14 Claims, 6 Drawing Sheets

CONFIGURATION AND METHOD OF MANUFACTURING THE ONE-TIME PROGRAMMABLE (OTP) MEMORY CELLS

This Patent Application is a Divisional application and claims the Priority Date of a application Ser. No. 11/518,001 filed on Sep. 7, 2006 now U.S. Pat. No. 7,602,029 by a common Inventor of this Application. The Disclosures made in the patent application Ser. No. 11/518,001 are hereby incorporated by reference.

BACKGROUND OF THE INVENTION

1.. Field of the Invention

The invention relates generally to a circuit configuration and method of manufacturing programmable memory devices. More particularly, this invention relates to an improved circuit configuration and method for manufacturing a one-time programmable (OTP) memory cells.

2.. Description of the Relevant Art

The need for precision power management products and circuits are increasing with reduction in power supply voltage and higher frequency of operation. Band-gap circuits, output voltage and frequency need precise control in modem power circuits. In the past, the precise control was obtained by using wafer level trim techniques such as metal/poly fuses and forward/reverse trimming of Zener diodes. However, often wafer trim techniques are not sufficient to maintain the precision even after the chip is packaged due to the additional stress and charges induced by the package. Due to this reason, there is a need for post package trimming using one-time programmable devices.

Most prior art post package trim techniques use an NMOS-FET with a floating gate that is coupled to the control gate through a coupling capacitor. FIG. 1A shows a double poly stacked gate structure where the partial overlap of floating gate and control gate forms the coupling capacitor. The operational principle is to collect electrons in the floating gate and shift the threshold voltage of the NMOSFET. The electrons are collected using different techniques such as Fowler-Nordheim tunneling and HCI hot carrier injection. To improve the tunneling efficiency and lower the trimming voltage, different techniques are applied to enhance the electrical field in the carrier injection region. FIG. 1B shows another stacked gate structure where a portion of floating gate oxide is thinned to improve electron-collecting capability. However the removal of partial gate oxide requires extra etching step therefore increases the cost.

One-time programmable devices for post package trimming usually are processed at the same time as the functional circuit using standard CMOS technologies. For improving the hot-carrier degradation in the mainstream sub-micron CMOS technologies, a sidewall spacer with lightly doped drain (LDD) implant is used to reduce the drain to substrate field at the drain end of the channel. However, in order to increase the efficiency of electron injection into the floating gate of an NMOS, a higher drain field becomes necessary. FIGS. 2A and 2B are two cross sectional views for illustrating the configurations of another conventional OTP memory cells structure form by single poly process where FIG. 2A is the floating gate NMOS and FIG. 2B is the coupling capacitor using PMOS. As that shown in FIG. 2A, prior art structures use a deep heavily doped N region in the drain region to increase the electrical field at the drain region. The low concentration N-dopant LDD is wiped out due to the high dopant concentration of the deep N doped region and this increases the electric field at the drain junction. The floating gate is coupled to the control gate through a P-MOS capacitor as shown in FIG. 2B. The coupling ratio between the NMOS gate capacitance and the coupling capacitor determines how much voltage that is presented on the floating gate when compared to the voltage applied on the control gate. Typically, the coupling ratio is about 6. to 10, thus the coupling capacitor is six to ten times higher than the NMOS gate capacitance. During the process of programming a drain voltage for applying to the NMOS and a high gate voltage is applied to the control gate to collect the hot electrons or tunnel electrons flowing in the high field region of the NMOS drain region. A higher threshold on the NMOS implies that the electrons have been collected in the floating gate. Although the application of deep N region wipe out the LDD region therefore increase the electrical field at the drain region, the voltage applied to control gate for programming still not low enough for many applications that require fast programming.

Therefore, a need still exists in the fields of circuit design and device manufactures for providing a new and improved circuit configuration and manufacturing method to resolve the above-discussed difficulties. Specifically, a need still exists to provide new and improved OTP manufacturing processes and configuration that can overcome the difficulties generated by the LDD difficulties. Furthermore, a simplified configuration is also required to reduce the manufacturing complexities to achieve lower production cost and meanwhile increase the production yield while providing device with improved performance and reliability.

SUMMARY OF THE PRESENT INVENTION

It is therefore an aspect of the present invention to provide an improved configuration and manufacturing processes for making an OTP memory by implementing a single polysilicon OTP implanted with a P-drift region. The P-drift region increases the substrate dopant concentration thus increases the electrical field near the drain region. The efficiency of creating hot electrons is increased and higher programming efficiency is achieved.

It is another aspect of this invention that the OTP memory is connected to a coupling capacitor via the single polysilicon stripe. The coupling capacitor is implemented in a preferred embodiment as a PMOS complementary to the NMOS transistors of the OTP memory device in a common N-well. The P-drift region implanted for the OTP transistor is also simultaneously implanted as a source and drain for the coupling capacitor formed as a PMOS device. There are no additional implanting steps required in forming the drift region and the PMOS device as the coupling capacitor.

Another aspect of this invention is to form the OTP with a first and second MOS transistor sharing the gate, drain and source region by applying a drift region implantation to delineate the first and second MOS transistors. The drift region implanted with a P-dopant is diffused into the channel regions from under the source and drain to counter dope a lightly dope drain region. The dopant profile of the drift region implanted is gradually decreased and ended at the boundary between the first and second MOS transistors thus creating a higher threshold voltage for the first MOS transistor with a higher level of dopant concentration and maintaining the same threshold voltage for the second MOS transistor functioning as a regular NMOS through the farther end of the first MOS transistor that has a decreased level of dopant concentration and LDD region.

Another aspect of this invention is to form the coupling capacitor as an array of MOS transistors with the source, drain and body interconnected and connected to the OTP memory through the single polysilicon striped formed as multiple-branched extensions, e.g., finger-shaped branches. The P-drift region is also formed to encompass and surround the array of MOS transistors to improve the linearity or series resistance of coupling capacitor. Instead of using a whole poly plate to form a big PMOS capacitor, the poly plate is formed as branches into a plurality of fingers forming a plurality of small PMOS capacitors in parallel. Again, the P-drift region is formed simultaneously with the drain and source regions and there are no additional processing steps required.

Briefly in a preferred embodiment this invention discloses a one time programmable (OTP) memory. The OTP memory includes a first and a second metal oxide semiconductor (MOS) transistors connected in parallel and controlled by a single polysilicon stripe functioning as a gate wherein the OTP memory further includes a drift region encompassing and surrounding a drain and a source of the first MOS transistor having a different threshold voltage than the second MOS transistor not reached by the diffusion of drift implant region. In a preferred embodiment, the first and second MOS transistors are N-MOS transistors disposed in a common P-well and the drift region of the first MOS transistor further comprising a P-drift region.

The present invention further discloses a method for manufacturing an OTP memory device that includes a first and second MOS transistors connected in parallel and controlled by a common gate formed with a single polysilicon stripe. The method further includes a step of implanting a drift region in a substrate region below a drain and source of the first MOS transistors encompassing and surrounding a drain and a source of the first MOS transistor having a different threshold voltage than the second MOS transistor not reached by the diffusion of drift implant region. In a preferred embodiment, the step further includes a step of manufacturing the first and second MOS transistors as N-MOS transistors disposed in a common P-well and implanting and diffusing the drift region of the first MOS transistor as a P-drift region.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
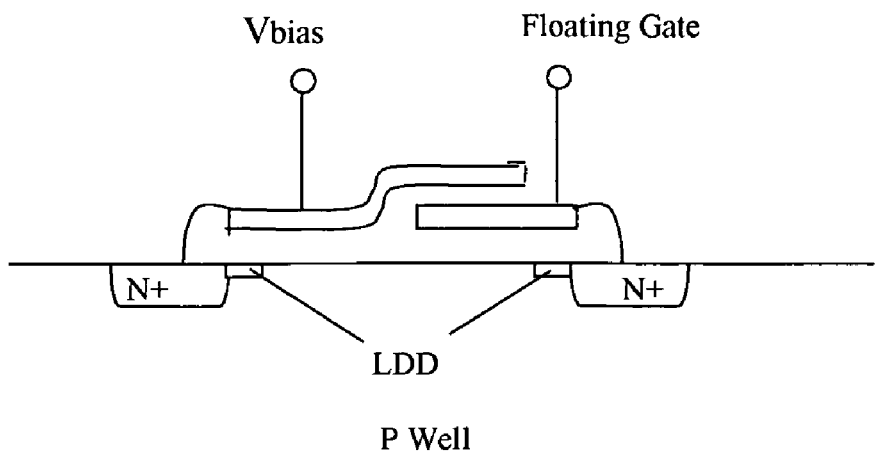
FIGS. 1A and 1B are two cross sectional views for showing the device configuration of conventional one-time programmable memory devices.
Figure 1B:
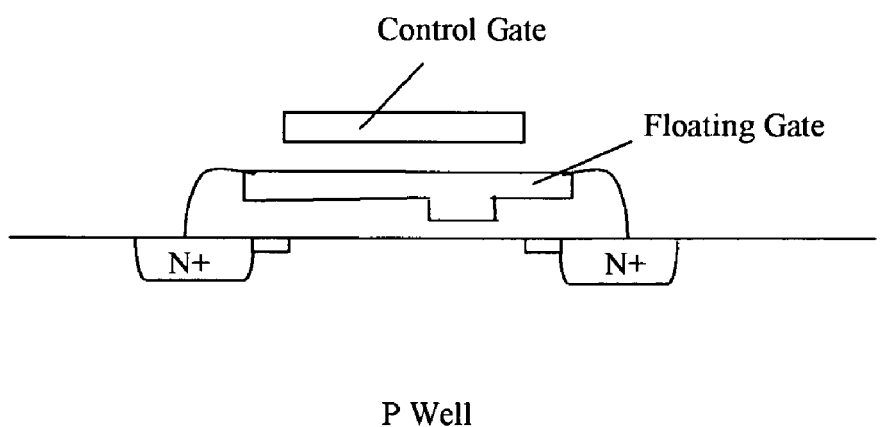
Figure 2A:
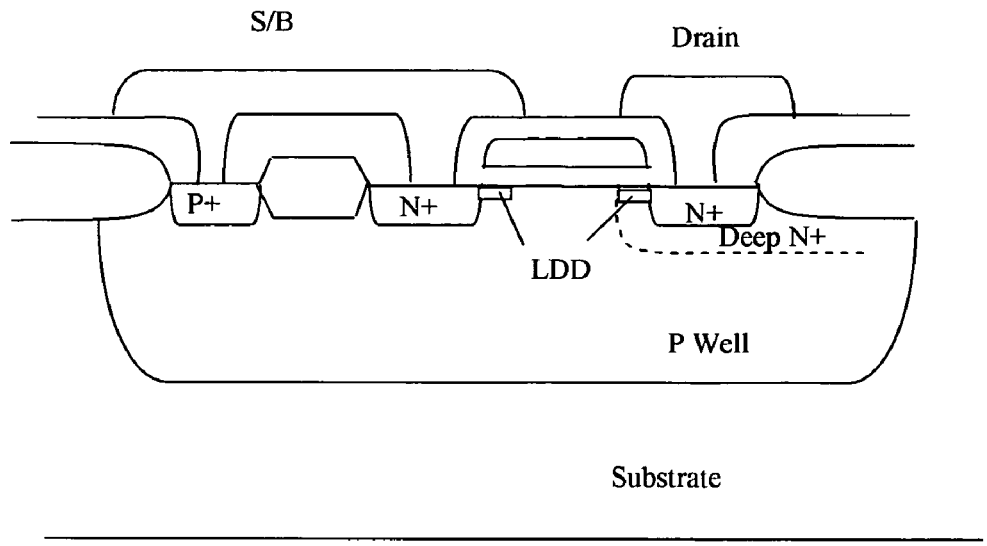
FIGS. 2A and 2B are two cross sectional views for showing the NMOS configuration and the coupling capacitor using PMOS of another conventional OTP device.
Figure 2B:
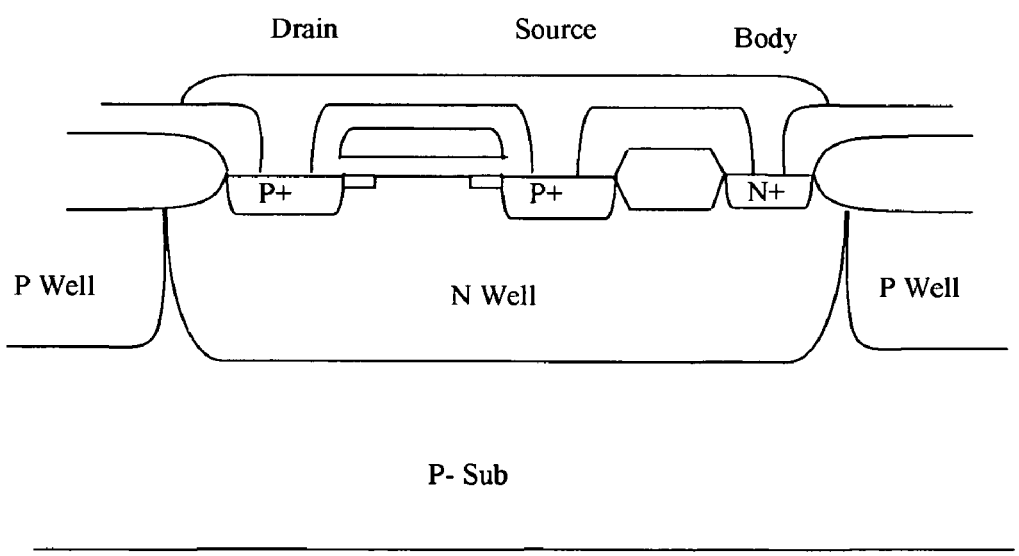
Figure 3A:
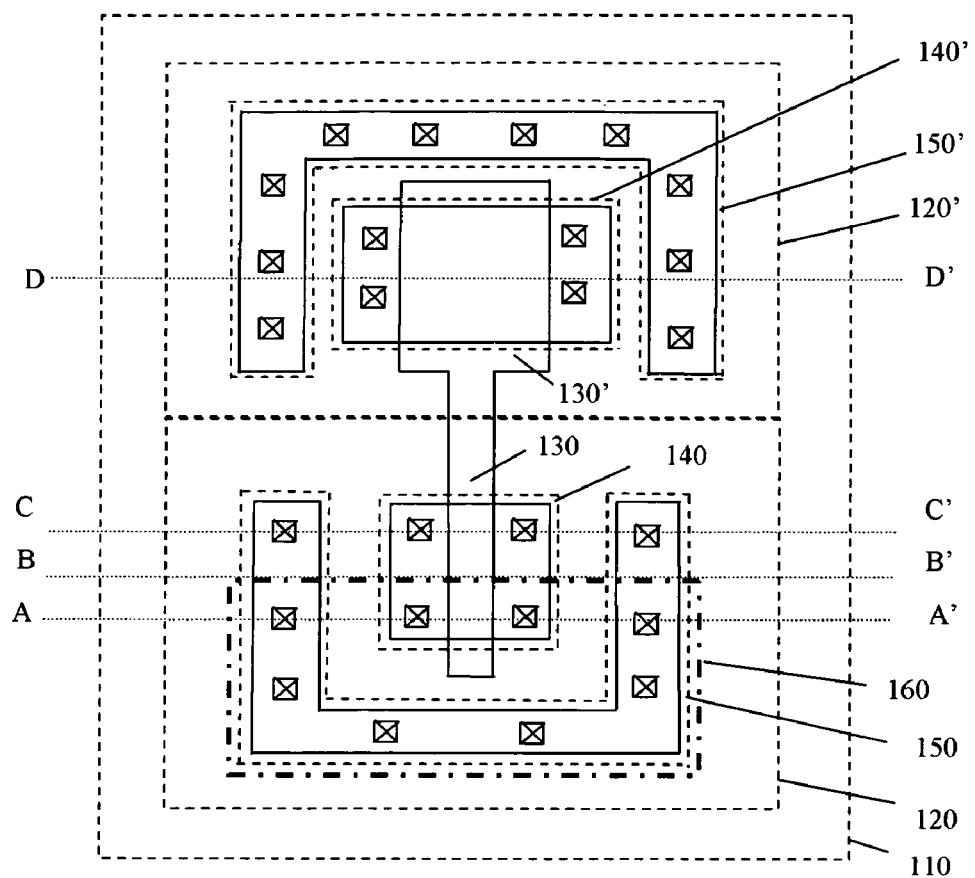
FIG. 3A is a top view and FIG. 3B is a circuit diagram of a new OTP memory device of this invention.
Figure 3B:
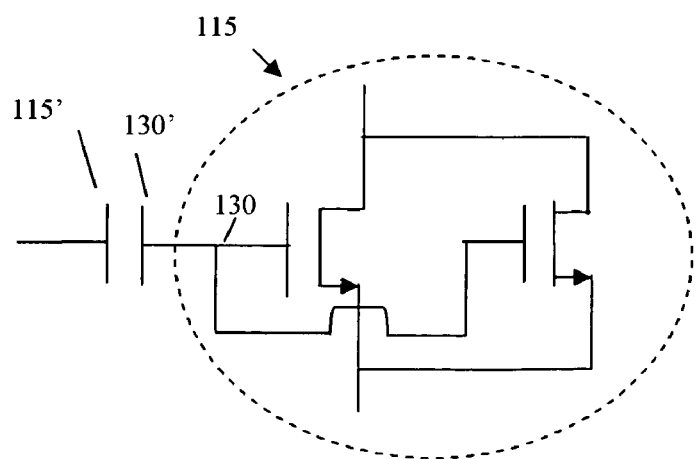
Figure 4A:
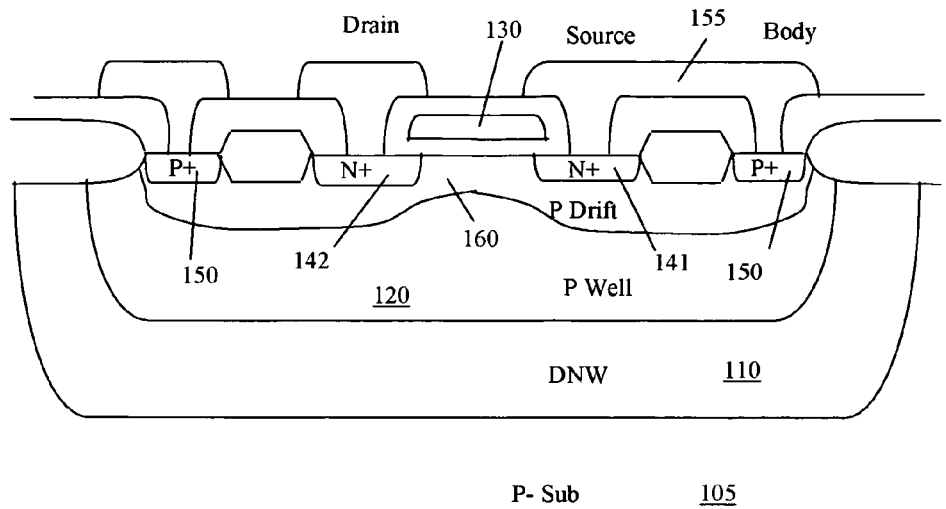
FIGS. 4A to 4D are four cross sectional view for showing the OTP memory device across four different cross-sectional lines of FIG. 3A.
Figure 4B:
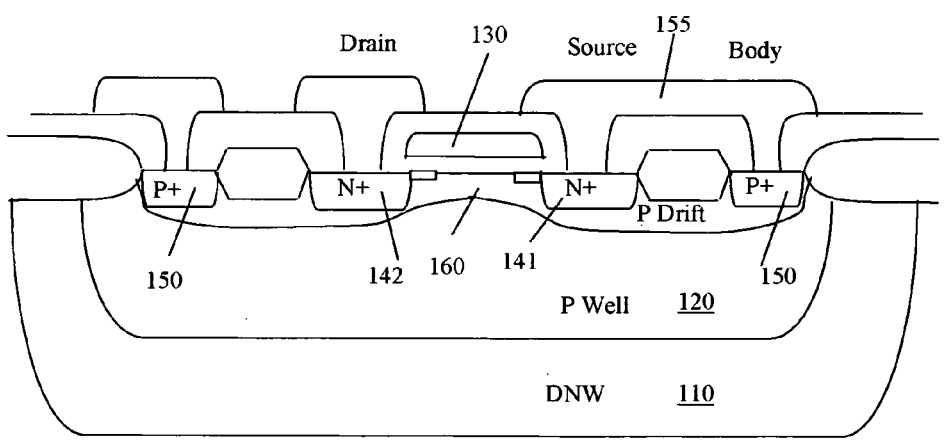
Figure 4C:
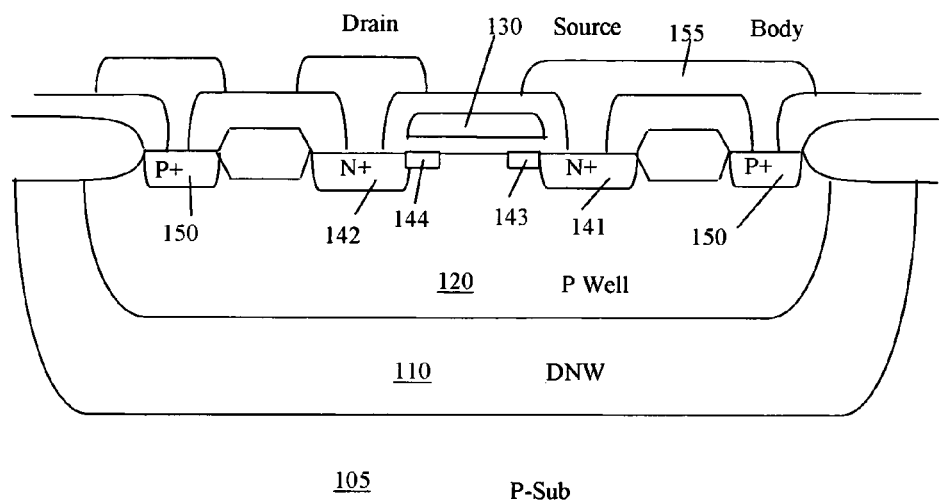

Referring to FIG. 3A for a top view of a one-time programmable (OTP) memory device with cross sectional views across lines A-A', B-B', C-C' and D-D' shown in FIGS. 4A, 4B, 4C and 4D respectively. An equivalent circuit diagram is shown in FIG. 3B. The OTP memory device is encompassed within a deep N-well (DNW) region 110 supported on a substrate 105. The OTP device includes an NMOS region 115 formed within a P-well 120 and a coupling capacitor using PMOS 115' inside an N-well 120'. On top of P-well 120 an insulated doped poly stripe 130 is disposed to function as a gate of NMOS. An N+ dopant region 140 is then implanted to from the source 141 and drain 142 self-aligned to the poly gate stripe 130. A P+ dopant implanted region substantially surrounding the N+ dopant source and drain regions provides low resistant body contact 150 short to source by metal connection 155. In the lower portion of P well 120, a P drift region 160 is form. P drift region 160 may extend beyond the drain/source implant region 140. As showing in the figures, the P drift region 160 extends beyond the body contact region 150. The P drift region 160 may be formed before or after the gate 130. FIGS. 4A-4D show an embodiment where P+ dopant is implanted after the formation of gate 130 therefore a depth of P drift region directly under the gate is shallower forming a bump. FIG. 4A is the cross sectional view of the NMOS region right across the P drift region. As a portion of the lower part of drain/source implant is compensated by the P+ dopant of P drift region, the source and drain regions are shallower. Compare to FIG. 4B for a cross sectional view of the device NMOS region across the edge of P drift region, P drift region 160 in this area is form through lateral diffusion therefore the source and drain are deeper and the P drift region is shallower as the P dopant is lighter in this area. FIG. 4C is the cross sectional view of the device NMOS region away from the drift region 160. The LDD regions 143 and 144 formed by standard CMOS process are remained in this area where no P dopant is implanted to compensate the N low-doped regions. In FIGS. 4A and 4B, the dopant concentration of the LDD regions are compensated by the P drift region dopant that increases the P concentration therefore creates a higher electric filed in source body junction area improving the carrier injection efficiency. On the other hand, the increase P dopant due to this P drift region also increases the NMOS threshold. Thus the NMOS 115 as shown in FIG. 3A is configured into two NMOS in parallel, a higher threshold NMOS with improved carrier injection in the P drift region and a regular NMOS with low gate threshold as shown in FIG. 3B.

Figure 4D:
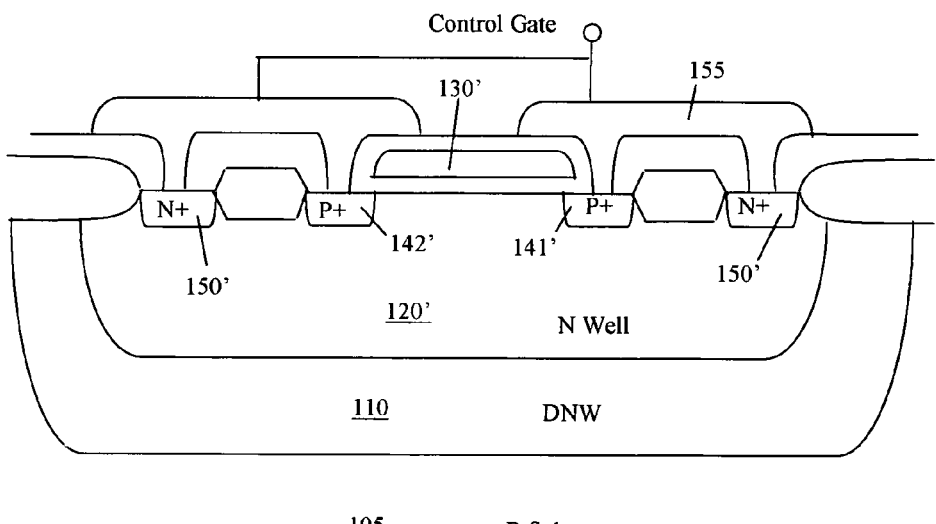

Referring back to FIG. 3A, poly gate 130 extends into N well 120' connecting to a poly plate 130'. As shown in FIG. 4D a cross sectional view along dash line D-D', poly plate 130' also functions as an insulated gate for a PMOS 115'. A P+ dopant region 140' is then implanted to from the source 141' and drain 142' self-aligned to the poly gate 130'. An N+ dopant implant substantially surrounding the P+ dopant source and drain regions provides low resistant body contact 150' short to source and drain by metal connection 155' connecting to a control gate signal. Since the source, drain and body all short together, PMOS 115' essentially functions as a capacitor between N well 120' and poly plate 130'as in FIGS. 3B and 4D. Other types of capacitors, such as poly-poly and metal-poly capacitors are suitable.

In this invention, a single poly OTP is described by implanting a P-drift region into the NMOS structure as shown in FIG. 3A and its equivalent circuit in FIG. 3B. This P-drift region increases the substrate doping which increases the electrical field near the drain region. An increased electrical field on the drain region means higher efficiency for creating hot electron and consequently programming. Since this P-drift region is also used as the drain region of high voltage PMOS device and also as base of NPN devices incorporating the OTP, it does not add any additional cost for adding an OTP into the technology. Although the P-drift region is optimized for the high voltage PMOS devices, it can be used efficiently to create high field region as illustrated by FIGS. 4A to 4D. FIG. 4A illustrates the scenario when the P-drift region doping is high enough to completely wipe out the N-LDD and consequently disconnecting the channel. However, since the P-drift region laterally diffuses into the channel region from the channel width direction, the N-LDD connects the channel to N+ at some point in the laterally diffused region of the P-drift as shown in FIG. 4B. After the P-drift region completely diffuses laterally (FIG. 4C), the NMOS behaves like a regular device. Due to this reason, the equivalent circuit (FIG. 3B) shows two NMOSFETs in parallel—one regular NMOS with lower VT and the other NMOS with P-drift body with higher VT.

Figure 5A:
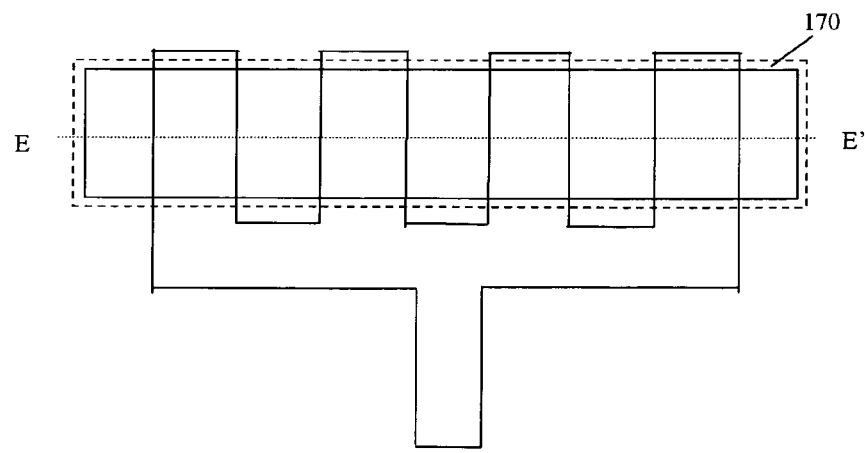
FIG. 5A is a top view and FIG. 5B is a cross sectional view of another embodiment of the OTP memory device of this invention.
Figure 5B:
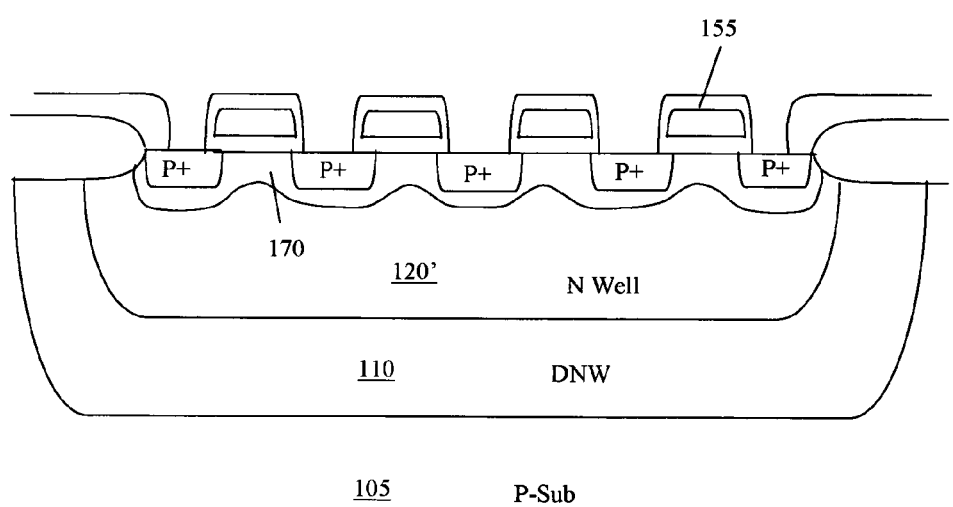

FIG. 5A shows the layout and FIG. 5B shows the cross section of another embodiment of improved coupling capacitor using P drift to improve linearity or series resistance of coupling capacitor. Instead of using a whole poly plate to form a big PMOS capacitor, the poly plate in FIG. 5A branches into a plurality of fingers forming a plurality of small PMOS capacitors in parallel. P drift implant is carried out in the active region 170 to improve linearity or series resistance of coupling capacitor. Since this P-drift region is also used as the drain region of high voltage PMOS device and also as base of NPN devices incorporating the OTP, it does not add any additional cost for adding an OTP into the technology. It is worthy to note that the coupling capacitor may be any type of capacitor, such as NMOS capacitor, poly-poly capacitor or poly-metal capacitor.

According to above descriptions and drawings, this invention discloses a one-time programmable memory device. The one-time programmable memory includes a first and a second metal oxide semiconductor (MOS) transistors connected in parallel and each of the transistors includes a source and a drain disposed on opposite sides of a gate wherein the first and second MOS transistors disposed immediate adjacent to each other in a common doped-well region sharing a single polysilicon stripe as a gate and sharing doped regions to function as the source and drain for the first and second MOS transistor. The first MOS transistor further includes a doped drift region encompassed by the common doped well region and encompassing and surrounding the drain and source of the first MOS transistor for generating a different threshold voltage for the first MOS threshold than the second MOS transistor. The drift region of the first MOS transistor further increases a substrate dopant concentration for increasing an electrical field near the drain of the first MOS transistor whereby higher efficiency of hot electron generation is achieved for improving a programming performance. In an exemplary embodiment, the first and second MOS transistors are N-MOS transistors disposed in a common P-well and the drift region of the first MOS transistor further includes a P-drift region. In another embodiment, the drift region of the first MOS transistor is diffused into a channel region between the source and drain from a channel width direction to counter dope a lightly dope drain (LDD) region constituting a gradually dopant decreasing profile in a region underneath the source and drain whereby drift region ended before reaching the second MOS transistor. In another embodiment, the OTP memory further includes a third MOS transistor having a complementary polarity with the first and second MOS transistor connected through the single polysilicon stripe wherein the third MOS transistor further includes a source, a drain and a body all interconnected thus functioning as a capacitor connected through the single polysilicon stripe to the first and second MOS transistor. Furthermore, the drift region formed for the first MOS transistor is applied to form the drain and source of the third MOS transistor having a complementary polarity. In another embodiment, the first and second MOS transistors are N-MOS transistors disposed in a common P-well and the drift region of the first MOS transistor further includes a P-drift region, and the OTP memory further includes a third P-MOS transistor connected through the single polysilicon stripe wherein the third MOS transistor further includes a source, a drain and a body all interconnected thus functioning as a capacitor connected through the single polysilicon stripe to the first and second MOS transistor. Furthermore, the P-drift region formed for the first N-MOS transistor is applied to form the drain and source of the third P-MOS transistor. In another embodiment, the OTP memory further includes an array of coupling MOS transistors each includes a complementary polarity with the first and second MOS transistor connected through multiple-branched extensions of the single polysilicon stripe wherein the coupling MOS transistors further includes a source, a drain and a body all interconnected thus functioning as array of parallel-coupling capacitors connected through the multiple-branched extensions of the single polysilicon stripe to the first and second MOS transistor. In another embodiment, the array of coupling MOS transistors further includes a coupling-transistor drift region encompassing and surrounding the drains and sources of the array of coupling MOS transistors whereby an improved linearity or a series resistance of coupling capacitor is achieved. In another embodiment, the coupling-transistor drift region encompassing and surrounding the drains and sources of the array of coupling MOS transistors having a same polarity as the drift region of the first MOS transistor whereby the coupling-transistor drift region is formed simultaneously as the drift region of the first MOS transistor. In another embodiment, the OTP memory further includes a third MOS transistor having a same polarity as the first and second MOS transistor connected through the single polysilicon stripe wherein the third MOS transistor further includes a source, a drain and a body all interconnected thus functioning as a capacitor connected through the single polysilicon stripe to the first and second MOS transistor. In another embodiment, each of the first, second and third MOS transistors further includes an N-MOS transistor. In another embodiment, the OTP memory further includes a coupling capacitor connected to the first and second MOS transistors. In another embodiment, the OTP memory further includes a poly-poly capacitor connected to the first and second MOS transistors to function as a coupling capacitor. In another embodiment, the OTP memory further includes a poly-metal capacitor connected to the first and second MOS transistors to function as a coupling capacitor.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A method for manufacturing a one-time programmable (OTP) memory comprising:

forming a first and a second metal oxide semiconductor (MOS) transistors immediate adjacent to each other in a common doped-well region of a first conductivity type in a semiconductor substrate and sharing a single poly-silicon strip on a top surface of said semiconductor substrate as a common gate for connecting the first and second MOS transistors in parallel; and wherein said step of forming the first and second MOS transistors further comprising a step of implanting a drift region in a substrate region with said first conductivity type to have a higher dopant concentration than said common doped well region of said first conductivity type and forming said drift region below and encompassing a drain and source of the first transistor to make the first MOS transistor to have a different threshold voltage than the second MOS transistor.

2. The method for claim 1 wherein:
said step of forming the first and second MOS transistor further comprising a step of manufacturing said first and second MOS transistors as N-MOS transistors disposed in a common P-well and implanting and diffusing the drift region of the first MOS transistor as a P-drift region.

3. The method claim 1 wherein:
said step of implanting said drift region of said first MOS transistor further comprising a step of implanting said drift region with said higher dopant concentration of said first conductivity type than said common doped well region to increase an electrical field near said drain of said first MOS transistor whereby higher efficiency of hot electron generation is achieved for improving a programming performance.

4. The method of claim 1 further comprising:
forming a third MOS transistor having a same polarity as said first and second MOS transistors connected through said single polysilicon stripe wherein said third MOS transistor further comprising a source, a drain and a body all interconnected thus functioning as a capacitor connected through said single polysilicon stripe to said first and second MOS transistors.

5. The method of claim 1 further comprising:
forming a third MOS transistor in another common doped-well region of a second conductivity type adjacent to said common doped-well region of said first conductivity type in said semiconductor substrate with said third MOS transistor having a complementary polarity with said first and second MOS transistors connected through said single polysilicon stripe wherein said third MOS transistor further comprising a source and a drain functioning as a capacitor connected through said single polysilicon stripe to said first and second MOS transistors; and
implanting said drain and source of said third MOS transistor with a complementary polarity simultaneously with the step of implanting said drift region for said first MOS transistor.

6. The method of claim 1 wherein:
said step of forming the first and second MOS transistor further comprising a step of manufacturing said first and second MOS transistors as N-MOS transistors disposed in a common P-well and implanting and diffusing the drift region of the first MOS transistor as a P-drift region,
forming a third MOS transistor in another common doped-well region of a second conductivity type adjacent to said common doped-well region of said first conductivity type in said semiconductor substrate with said third MOS transistor having a complementary polarity with said first and second MOS transistors connected through said single polysilicon stripe wherein said third MOS transistor further comprising a source and a drain functioning as a capacitor connected through said single polysilicon stripe to said first and second MOS transistors; and
implanting said drain and source of said third MOS transistor using a same dopant and carrying out simultaneously with the step of implanting said drift region for said first MOS transistor.

7. The method of claim 1 further comprising:
forming an array of coupling MOS transistors in another common doped-well region of a second conductivity type adjacent to said common doped-well region of said first conductivity type in said semiconductor substrate wherein each of said coupling transistors having a complementary polarity with said first and second MOS transistors connected through multiple-branched extensions of said single polysilicon stripe wherein each of said coupling MOS transistors further comprising a source and a drain functioning as array of parallel-coupling capacitors connected through said multiple-branched extensions of said single polysilicon stripe extended from said first and second MOS transistors.

8. The method of claim 7 further comprising:
forming coupling-transistor drift region of said first conductivity type in said common doped-well region encompassing said drains and source of said array of coupling MOS transistors whereby an improved linearity or a series resistance of coupling capacitor is achieved.

9. The method of claim 8 wherein:
said step of forming said coupling-transistor drift region further comprising a step of doping said coupling-transistor drift region with said first conductivity type having a same polarity as said drift region of said first MOS transistor.

10. The method of claim 1 further comprising:
forming a third MOS transistor having a same polarity as said first and second MOS transistors and connecting through said single polysilicon stripe wherein said third MOS transistor further comprising a source, a drain and a body all interconnected thus functioning as a capacitor connected through said single polysilicon stripe to said first and second MOS transistors.

11. The method of claim 10 wherein:
said step of forming first, second and third MOS transistors further comprising a step of forming each of said transistors as an N-MOS transistor in a common doped well region of a N-type conductivity type in said semiconductor substrate.

12. The method of claim 1 further comprising:
connecting a coupling capacitor to said first and second MOS transistors.

13. The method of claim 1 further comprising:
connecting a poly-poly capacitor in series to said first and second MOS transistors to function as a coupling capacitor.

14. The method of claim 1 further comprising:
connecting a poly-metal capacitor in series to said first and second MOS transistors to function as a coupling capacitor.

* * * * *